United States Patent [19]

Gingrich et al.

[11] Patent Number: 5,138,280

[45] Date of Patent: Aug. 11, 1992

[54] MULTICHANNEL AMPLIFIER WITH GAIN MATCHING

[75] Inventors: Randal R. Gingrich, Belleville; Nicholas L. Difiore, Farmington Hills, both of Mich.

[73] Assignee: Ford Motor Company, Dearborn, Mich.

[21] Appl. No.: 802,590

[22] Filed: Dec. 5, 1991

[51] Int. Cl.⁵ .......................... H03G 3/30; H03F 3/68
[52] U.S. Cl. ............................................. 330/295; 330/2; 330/84; 330/282
[58] Field of Search ............... 330/2, 86, 124 R, 282, 330/295, 84

[56] References Cited

U.S. PATENT DOCUMENTS 3,914,705  10/1975  Takahashi ................... 330/295 X

OTHER PUBLICATIONS

The Art of Electronics, P. Horowitz and W. Hill, Cambridge University Press, 1980, pp. 122-124.

*Primary Examiner*—James B. Mullins
*Attorney, Agent, or Firm*—Mark Mollon; Roger L. May

[57] ABSTRACT

A multichannel amplifier employs field-effect transistors to vary the gain of operational amplifiers in each respective channel. Gain matching of the respective channels is obtained by providing each channel with a respective DC bias voltage which compensates for differences in pinch-off voltage of the field-effect transistors. The invention permits the use of inexpensive, unmatched JFETs in the amplifier. Close gain tracking achieves very accurate stereo imaging in an audio system.

5 Claims, 2 Drawing Sheets

MULTICHANNEL AMPLIFIER WITH GAIN MATCHING

Cross-Reference to Related Application

This application is related to commonly assigned application Ser. No. 07/802,686, filed concurrently herewith and entitled "Voltage-Controlled Amplifier Using Operational Amplifier", which is incorporated herein by reference.

BACKGROUND OF THE INVENTION

The present invention relates in general to a multichannel amplifier wherein each channel employs an operational amplifier connected to a field-effect transistor to vary the amplifier gain, and more specifically, to a gain-matched multichannel amplifier wherein each channel has a respective DC bias voltage which compensates for differences in the field-effect transistors.

Amplification of electrical signals by a desired gain can be achieved using operational amplifier (op amp) integrated circuits. By providing negative feedback between the output of the op amp and its inverting input, the gain provided by such an amplifier is controlled by external resistances connected to the op amp as is known in the art. If one or more of the external resistances are variable resistances, the amplifier gain may be varied. Thus, a variable-gain amplifier can be realized by employing a potentiometer in the feedback path between the output and inverting input of the op amp, for example.

It is also known to employ a voltage-controlled attenuator such as a junction field-effect transistor (JFET) operating in its linear or triode region of operation as a variable gain-setting resistance used in conjunction with an op amp. Thus, a gate control voltage supplied to the JFET determines the amplifier gain. However, several disadvantages are associated with certain inherent properties of JFETs. Due to uncontrollable variations in the fabrication process of JFETs, various electrical properties, such as pinch-off voltage $V_p$, on-resistance $R_{ds(on)}$, and the resistance curve between $R_{ds(on)}$ and $V_p$, have a wide variation from one JFET to another JFET of the same design. The use of a JFET as a voltage-controlled attenuator is strongly influenced by these uncontrolled characteristics, thus limiting the usefulness of JFETs as attenuators. Testing of JFETs after manufacture to sort them according to similar characteristics greatly increase the costs associated with using JFETs as altenuators. Furthermore, sorting cannot eliminate all variability in the JFET characteristics.

Variations in the electrical properties of JFETs create problems if JFET-controlled op amps are to be used in multichannel audio amplifiers (e.g., audio limiters) which require that separate channel gains closely track each other. Even sorted JFETs do not provide sufficiently matched characteristics to obtain the required gain tracking.

The co-pending application mentioned above describes an invention that allows the setting of minimum and maximum gain by use of fixed resistors independently of the JFET characteristics. However, with JFET's having different pinch-off voltages $V_p$, gains may still not track sufficiently well (e.g., in a limiter, one channel may be attenuating while another is not).

SUMMARY OF THE INVENTION

It is a principal object of the present invention to provide a multichannel amplifier with accurate gain tracking between channels It is another objection of the present invention to employ JFETs connected to respective operational amplifiers in a multichannel amplifier with compensation for variations in pinch-off voltages $V_p$ of the JFETs.

These and other objects are achieved in a multichannel amplification system having a plurality of channels, each channel comprising an amplifier and a field-effect transistor (FET). External resistances including a respective FET are connected to each operational amplifier in a negative feedback arrangement for providing variable gain. The drain of each FET is connected to the inverting input of each respective op amp. The resistance provided by the FET is controlled by a control signal applied to the gate of the FET. Negative feedback allows the voltage at the inverting and noninverting inputs of each op amp to be substantially equal. Thus, bias voltages applied to the noninverting inputs of each respective op amp are offset in the present invention as necessary to compensate for differences in the pinch-off voltage of the FETs.

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

DETAILED DESCRIPTION OF PREFERRED EMBODIMENTS

Figure 1:
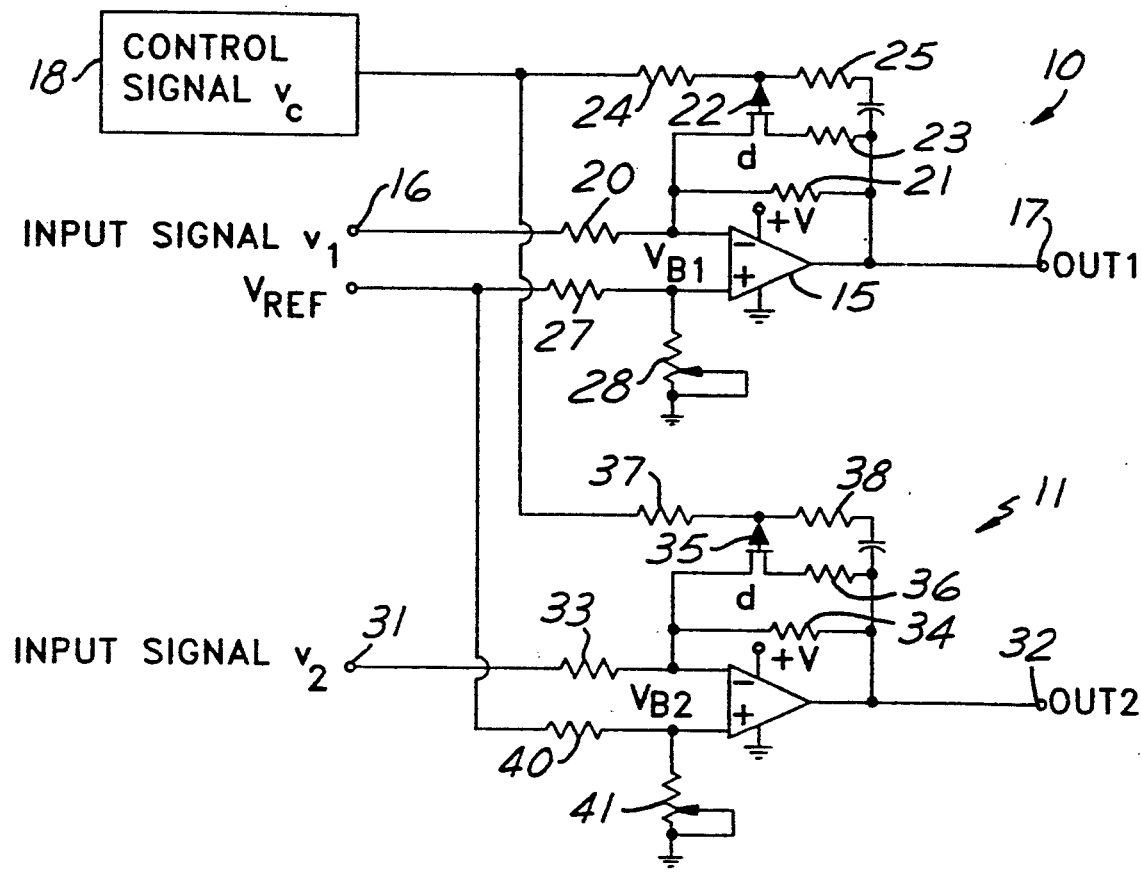
FIG. 1 is a schematic diagram of a multichannel amplifier according to the present invention.

FIG. 1 shows a multichannel amplifier including a first channel 10 and a second channel 11 of the type that is useful in a stereo reproduction system, for example. First channel 10 includes an operational amplifier (op amp) 15 for receiving an input signal $v_1$ at a terminal 16 and providing an amplified output signal OUT1 at a terminal 17. A variable gain is provided in response to a control signal $v_c$ provided from a control signal generator 18.

Input signal $v_1$ is coupled to the inverting input of op amp 15 through a resistor 20. Negative feedback between the inverting input and the output of op amp 15 are provided by a resistor 21 connected in parallel with a JFET 22 and a resistor 23. Control signal $v_c$ is coupled to the gate of JFET 22 through a resistor 24. A resistor 25 couples the gate of JFET 22 with the source terminal of JFET 22 in order to maximize the linear or triode region of operation.

In order to allow AC operation of op amp 15 with a single supply voltage, the op amp is operated with a DC bias as is known in the art. Specifically, the noninverting input of op amp 15 is biased to a DC bias voltage $V_{B1}$ obtained by dividing a reference voltage $V_{REF}$ at terminal 26 using a voltage divider comprising a resistor 27 connected in series with a trim resistor 28.

Second channel 11 of the multichannel amplifier includes an op amp 30 which amplifies an input signal $v_2$ at an input terminal 31 to provide an output signal OUT2 at an output terminal 32. Input signal $v_2$ is coupled to the inverting input of op amp 30 through a resistor 33. Negative feedback between the inverting input and the output of op amp 30 is provided by a resistor 34 connected in parallel with a JFET 35 and a resistor 36. The gate of JFET 35 receives control signal $v_c$ through a resistor 37. A resistor 38 is coupled between the gate and source terminals of JFET 35. The noninverting input of op amp 30 receives a bias voltage $V_{B2}$ obtained from a voltage divider comprising a resistor 40 and a trim resistor 41 which is connected to receive the reference voltage $V_{REF}$.

Op amps 15 and 30 are connected to a single power supply providing a voltage of $+V$ with respect to ground. When operating an op amp with a single power supply, it is known that the noninverting input of the op amp should be provided with a DC bias equal to about one-half the power supply voltage $+V$. Typically, each op amp in a prior art multichannel amplifier would receive the same bias voltage. However, since the actual DC bias is removed from each signal by filtering prior to the final stage of amplification, the particular value of the DC bias is not important (as long as there is sufficient voltage swing available to avoid clipping). Thus, the DC bias applied to each op amp in a multichannel amplifier need not be the same.

As described in related application Serial No. 07/802,686, gain in channels 10 and 11 are limited between minimum and maximum gains set by fixed resistors With JFETs 22 and 35 each pinched-off by a control signal $v_c$ which is greater than their respective pinch-off voltages $v_p$, channels 10 and 11 provide their maximum gain. When control signal $v_c$ is reduced in voltage level (thus allowing the JFETs to conduct current through their respective channels), the amplifier gains are reduced and a limiting function is performed.

Figure 2:
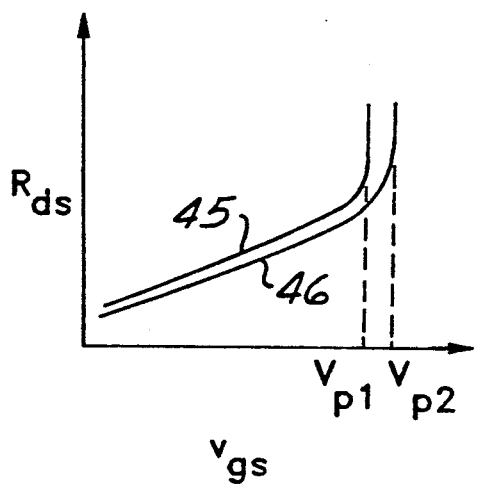
FIG. 2 is a plot of resistance characteristics for first and second JEETs.
Figure 3:
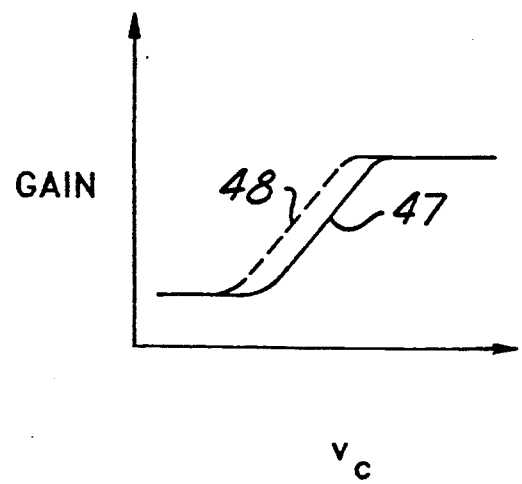
FIG. 3 is a plot of multichannel gain curves without the compensation provided by the present invention.
Figure 4:
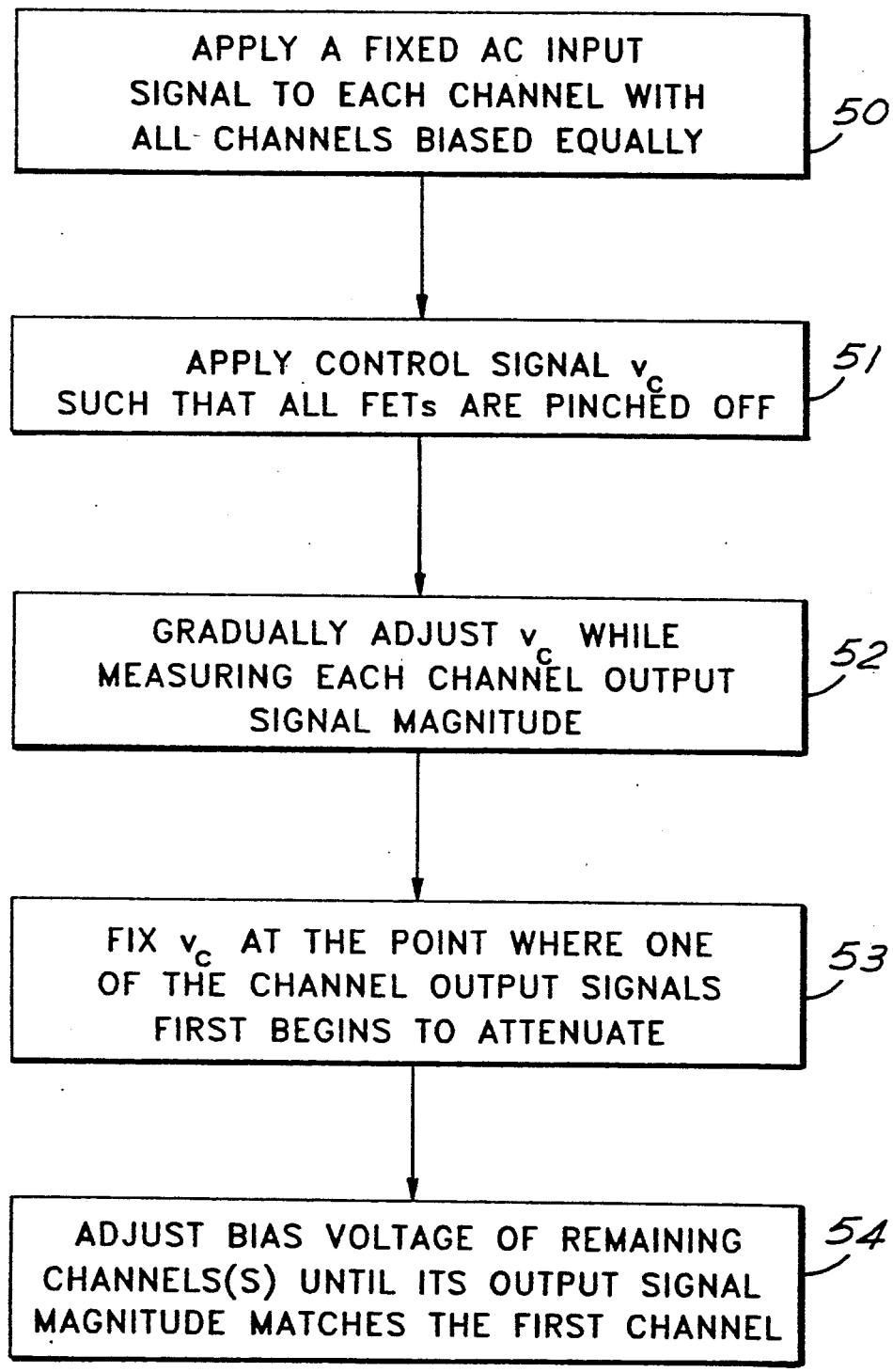
FIG. 4 is a flow chart illustrating a preferred according to the present invention.

FIG. 2 shows a variation in JFET characteristics which may be expected between individual devices due to uncontrollable parameters in JFET manufacturing. The resistance between the drain and source of a p-channel JFET is controlled by the gate-to-source voltage $v_{gs}$ when the JFET is operating in its linear or triode region (i.e., the drain-to-source voltage $v_{ds}$ must be small). With the gate voltage equal to zero, the drain-to-source resistance is at its minimum. The resistance increases substantially linearly with increasing gate voltage until prior to reaching the pinch-off voltage of the FET. A first JFET exhibits a characteristic 45 having a first pinch-off voltage $V_{p1}$ and a second FET has a characteristic 46 with a second pinch-off voltage $V_{p2}$. The difference in pinch-off voltage could lead to different gain curves between the amplifier channels as shown in FIG. 3. Gain curve 47 corresponds to the JFET having characteristic 46 in FIG. 2, and gain curve 48 corresponds to the JFET with characteristic 45. Thus, for control voltages between the separate pinch-off voltages of the FETs, one channel provides its maximum gain while the other provides less than its maximum gain.

This problem is corrected in the present invention by modifying gain curve 48 so that it corresponds with gain curve 47 by means of separately adjusting the DC bias level provided to the op amps. In FIG. 1, bias voltages $V_{B1}$ and $V_{B2}$ are adjusted so that their difference equals the difference between the pinch-off voltages of JFETs 22 and 35. Since the inputs to the respective op amps are biased at different voltages, the JFETs can reach pinch-off simultaneously even though they receive the same control signal (the gate-to-drain voltage $v_{gd}$ is approximately equal to the gate-to-source voltage $v_{gs}$ since the drain-to-source voltage $v_{ds}$ is small). The appropriate bias voltages are obtained by adjusting trim resistors 28 and/or 41 which preferably comprise a laser-trimmable, thick-film resistor but could alternatively be comprised of a Potentiometer or other variable resistance.

A preferred method for adjusting the DC bias voltage in a multichannel amplifier is shown in FIG. 40. Such adjustment is preferably done as a final adjustment in the manufacturing process of an audio amplifier system. In step 50, a fixed AC input signal is applied to the input of each channel of the amplifier while all channels receive substantially equal bias voltages. The AC input signal has a constant magnitude and constant frequency, for example. The AC input signal remains fixed throughout the entire calibration procedure. In step 51, control signal $v_c$ is provided at an initial value which is sufficiently large to keep all JFETs pinched off; i.e., all channels are at their maximum gain. In step 52, control signal $v_c$ is gradually adjusted (i.e., reduced) while the output signal magnitude is measured for all channels. Since the pinch-off voltages of the JFETs are not matched, one channel will be the first to show a reduced gain as control signal $v_c$ is adjusted. The channel which first begins to show a decrease in gain becomes the reference channel for adjusting the remaining channels.

In step 53, control signal $v_c$ is fixed at a point where the reference channel output signal is attenuated. In step 54, each remaining channel is individually adjusted by monitoring the channel output signal while adjusting the bias voltage to decrease the output signal magnitude until it matches the output signal magnitude in the reference channel The trim resistor may preferably be contained in a hybrid thick-film resistor which is trimmed using a laser trimmer.

An alternative method would be to directly measure the pinch-off voltages and to set the bias voltage according to the differences in pinch-off voltage. In addition, the present invention is useful with amplifier circuits using a double-ended power supply. In order to set the bias voltage applied to a particular op amp, the noninverting input of the op amp would be coupled to each power supply voltage through a respective resistance. At least one of the resistances would be variable to allow trimming of the bias voltage to an appropriate value between the power supply voltages While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A multichannel system wherein a plurality of input signals are each amplified by respective gains in response to a control signal, said system comprising:

control means for generating said control signal; and a plurality of channel means each coupled to said control means, each channel means for amplifying a respective input signal;

each channel means comprising:
- an operational amplifier having an inverting input, a noninverting input, and an output;
- a field-effect transistor with a gate, a source, and a drain and providing a respective pinch-off voltage, said drain being coupled to said inverting input, said field-effect transistor being connect to control the gain provided by said operational amplifier; and
- bias means for providing an adjustable DC bias voltage to said noninverting input;

wherein said DC bias voltages have respective voltages which compensate for differences in the respective pinch-off voltages of said field-effect transistors.

2. The system of claim 1 wherein said control means generates a common control signal coupled to each of said gates.

3. A method, in a multichannel amplifier, for matching gain characteristics of a plurality of operational amplifiers each controlled by a respective field-effect transistor having a control voltage applied to the gate thereof, said method comprising the steps of:
- applying a fixed, predetermined input signal to each channel of said multichannel amplifier;
- applying a common control voltage to each of said gates at an initial voltage which is sufficient to cause each field-effect transistor to become Pinched-off;
- monitoring the magnitude of each output signal from each respective channel;
- adjusting said common control voltage until a first one of said output signals is attenuated;
- maintaining said common control voltage at a final voltage where said first output signal is attenuated; and
- adjusting a bias voltage applied to the operational amplifier of each remaining channel until its respective output signal is substantially equal to said first output signal 4. The method of claim 3 wherein each respective bias voltage is obtained from a respective resistive voltage divider and wherein said bias voltage adjusting step is comprised of trimming a respective resistive voltage divider.

5. The method of claim 4 wherein said trimming step is comprised of laser trimming a thick-film resistor

* * * * *